United States Patent [19]

McCormick et al.

[11] Patent Number: 5,328,501
[45] Date of Patent: Jul. 12, 1994

[54] PROCESS FOR THE PRODUCTION OF METAL PRODUCTS B9 COMBINED MECHANICAL ACTIVATION AND CHEMICAL REDUCTION

[75] Inventors: Paul G. McCormick, South Perth; Graham B. Schaffer, Subiaco, both of Australia

[73] Assignee: The University of Western Australia, Australia

[21] Appl. No.: 689,253

[22] PCT Filed: Dec. 21, 1989

[86] PCT No.: PCT/AU89/00550

§ 371 Date: Aug. 19, 1991

§ 102(e) Date: Aug. 19, 1991

[87] PCT Pub. No.: WO90/07012

PCT Pub. Date: Jun. 28, 1990

[30] Foreign Application Priority Data

Dec. 22, 1988 [AU] Australia ............... PJ2092/88

[51] Int. Cl.⁵ ............................................. C22C 1/04
[52] U.S. Cl. ............................................ 75/352; 75/354
[58] Field of Search ............... 75/351, 352, 354; 505/1

[56] References Cited

U.S. PATENT DOCUMENTS

| 4,427,447 | 1/1984 | Ramanarayahan et al. | 75/354 |
| 4,443,249 | 4/1984 | Weber et al. | 75/352 |
| 4,486,225 | 12/1984 | Osborn et al. | 75/361 |
| 4,668,282 | 5/1987 | Gilman et al. | 75/351 |
| 4,962,084 | 10/1990 | de Barbadillo et al. | 75/352 |
| 4,965,249 | 10/1990 | DeWith et al. | 505/1 |
| 5,147,449 | 9/1992 | Grewe et al. | 75/354 |
| 5,149,381 | 9/1992 | Grewe et al. | 148/403 |

FOREIGN PATENT DOCUMENTS

| 1261326 | 2/1968 | Fed. Rep. of Germany . |
| 856598 | 6/1940 | France . |
| 1100993 | 9/1955 | France . |
| 143312 | 4/1962 | New Zealand . |
| 143693 | 4/1969 | New Zealand . |
| 152547 | 5/1970 | New Zealand . |
| 152279 | 11/1970 | New Zealand . |
| 626653 | 7/1949 | United Kingdom . |
| WO89/10194 | 11/1989 | World Int. Prop. O. . |

OTHER PUBLICATIONS

Derwent Abstract Accession No. 87-190393/27, Class P53, SU,A, 1169263 (AS SIBE Mineral Ore), 23 Nov. 1986.

Derwent Abstract Accession No. 87-248251/35, Class L02, SU,A 1281550 (VNIIENERGOTSVETMET), 7 Jan. 1987.

Primary Examiner—George Wyszomierski
Attorney, Agent, or Firm—Bacon & Thomas

[57] ABSTRACT

A process for the production of a metal product which comprises subjecting a mixture of at least one reducible metal compound and at least one reducing agent to mechanical activation to produce a metal or alloy. Preferably, the mechanical activation is performed in an inert or reducing atmosphere. More than one reducing agent may be used. A ceramic material may be produced by including a nonmetal, or a compound which provides the nonmetal, into the starting materials. At least one other metal or a metalloid may be included in the starting materials for incorporation into the final product.

45 Claims, No Drawings

PROCESS FOR THE PRODUCTION OF METAL PRODUCTS B9 COMBINED MECHANICAL ACTIVATION AND CHEMICAL REDUCTION

This invention relates to a process for the production of metals, alloys and ceramic materials. More specifically, the invention is concerned with the mechanically activated chemical reduction of reducible metal compound(s) to produce metals, alloys or ceramic materials.

Most metallic elements occur in nature as oxides sulphides or phosphates in ore bodies. The refining process generally involves separation of pure oxides, sulphides and/or phosphates from the ore, and one or more reduction processes to convert the oxide, sulphide and/or phosphate to pure metal.

While the reduction process is specific to the particular element being refined, it usually involves either a chemical reaction, where the oxide, sulphide and/or phosphate is reduced by a second, more electro-positive element, or an electrochemical reaction driven by an electrical potential. Chemical reduction processes frequently require high temperatures, with one or more of the reactants being in the gas or liquid phase, so that sufficiently high reaction rates can be achieved.

In most conventional processes, pure metals are produced which are then mixed with other metals to form alloys using various melting and casting techniques. In some instances, where the production of alloys from pure metals is technically difficult or costly, it is possible to design chemical reduction processes which start with an appropriate mixture of metal oxides. The oxide mixture is directly reduced in a single step to the desired alloy composition by the addition of an appropriate reducing agent and high temperatures. Such processes include the reduction diffusion process and the co-reduction process used in the production of rare earth magnets. These processes use calcium as the reducing agent and involve heating to temperatures of above 1000° C.

An alternative process to the production of alloys by melting their pure constituents is known as mechanical alloying. Mechanical alloying enables the production of alloys from powders of the pure constituents without the need for melting or high temperatures. The mechanical alloying process may be carried out in a high energy ball mill. The milling action causes repeated fracture and cold welding of the powder particles during ball-powder-ball and ball-powder-container collisions. The alloying process takes place as an inter-diffusion reaction across atomically clean surfaces joined by cold welding. Given sufficient time, the mechanical alloying process can produce a true alloy at the atomic level. It has been shown that it is possible to prepare certain alloys by the mechanical alloying process which were otherwise impossible to prepare by conventional means. It has also been shown that mechanical alloying can be used to produce amorphous alloys, particularly when the elemental powders exhibit a large positive heat of reaction, as well as intermetallic compounds and dispersion hardened alloys.

The present invention is concerned with a new chemical reduction process termed "mechanically activated chemical reduction" for manufacturing metals or alloys from reducible metal compound(s). The mechanically activated chemical reduction process is essentially an adaption of the mechanical alloying process. During the mechanically activated chemical reduction, chemical reduction reactions are caused to occur, as a consequence of the mechanical action, which results in the reduction of the metal compound(s) to the metal or alloy.

The mechanically activated chemical reduction process of the present invention also extends to the production of ceramic materials, that is, materials which contain one or more phases that are compounds of metals and non-metals. Thus, the process is capable of producing products which range from pure metals and their alloys with other metals or metalloids through to ceramic materials, which may also include metals and/or metalloids in their composition.

According to the present invention there is provided a process for the production of a metal, alloy or ceramic material, characterised in that:

a mixture of at least one reducible metal compound and at least one reduction agent is subjected to mechanical activation to produce a metal or alloy product;

optionally a non-metal, or a compound which provides the non-metal, is included in the reaction mixture to produce a ceramic material product; and/or optionally at least one other metal or a metalloid is included in the reaction mixture for incorporation into the ceramic material or alloy product.

Thus, in one aspect of the process, a reducible metal compound is subjected to mechanical activation in the presence of at least one reducing agent to produce a metal product.

In another aspect, two or more reducible metal compounds may be used to produce a mixture of metals or an alloy product.

Alternatively or additionally a further metal and/or metalloid may be included in the reaction mixture so that the further metal and/or metalloid is incorporated into the metal, metal mixture or alloy product.

In a still further embodiment, a non-metal, or compound which provides the non-metal, may be included in the reaction mixture to produce a ceramic material.

Here again, a further metal and/or metalloid may be included the reaction mixture so that the further metal and/or metalloid is incorporated into the ceramic material product.

In a particularly preferred embodiment, the mechanical activation is produced by high energy ball milling. The term "high energy milling" refers to a condition which is developed in the ball mill when sufficient mechanical energy is applied to the total charge such that a substantial portion of the ball elements are continuously and kinetically maintained in a state of relative motion and that the energy imparted to the balls is sufficient to cause fracture and welding of powder particles during ball-powder-ball and ball-powder-container collisions.

In the high energy ball mill, solid particles, such as, the metal compound(s), non-metal(s) or the compound(s) which provide the non-metal(s), and the reducing agent particles are repeatedly deformed, fractured and rewelded. When particles are trapped between colliding balls, the force of the impact deforms and fractures particles, creating atomically clean new surfaces. When the clean surfaces come in contact, they weld together. Since such surfaces readily oxidize, the milling operation is preferably conducted in an inert or reducing atmosphere.

The high energy ball mill may be of any suitable known type. For example, the mill may comprise a vertical drum with a series of impellers inside it. A powerful motor rotates the impellers, which in turn agitate the steel balls in the drum. Such a machine can achieve grinding rates more than ten times higher than those typical of a conventional mill. A mill of this type, commonly known as an "attritor", is described in U.S. Pat. No. 2,764,359 and in Perry's Chemical Engineer's Handbook, 5th edition, 1973, at pages 8–29 to 8-30. Alternatively, the high energy ball mill may be a gravity dependent ball mill such as that described in U.S. Pat. No. 4,627,959.

It will be appreciated that the mechanical activation may be achieved by means other than high energy ball milling. In this specification, the term "mechanical activation" includes any process which causes deformation, welding and fracture of the powder particles by mechanical means, and thus includes processes such as, cold rolling or extrusion.

For convenience, in the following description, relating to preferred aspects and features of the invention, reference will be made to mechanical activation by high energy ball milling. It will be appreciated, however, that the invention is not limited to this technique and that other mechanical activation processes having the same effects can be substituted for ball milling.

The reducing agent may be solid, liquid or gaseous, and two or more reducing agents may be used if required. With solid reducing agents the reduction reaction occurs at or near the interfaces during the compaction and welding of the metal compound(s) and the reducing agent particles. This process continues until the metal, alloy or ceramic material is formed.

With liquid or gaseous reducing agents, the reaction occurs as a result of the contact of fresh metal compound surfaces created by the ball/powder collisions in the high energy ball mill with the reducing atmosphere. The efficiency of the process will depend on the nature of the metal compound(s) being reduced and the processing parameters used. The latter include collision energy, collision frequency, ball/powder mass ratio, ball mass, number of balls, milling time, temperature, atmosphere and lubricant. The addition of a lubricant or other process control agent may enhance the environment in which the metal compounds are reduced. The lubricant or other process control agent modifies the rates of fracture and welding and may act as a thermal diluent, preventing combustion.

The processing parameters depend on the nature of the materials treated and the mechanical activation employed. By way of example, the following parameters for high energy ball milling are preferred.

| Collision energy: | 0.1–1.0J, more preferably about 0.25J |
| Collision frequency: | 1–200 Hz |
| Ball/powder mass ratio: | 2:1 to 40:1, more preferably 10:1 to 30:1 |
| Milling time: | less than 72 hours, more preferably less than 24 hours |
| Atmosphere: | gaseous hydrogen or an inert gas, for example, argon or nitrogen with residual oxygen and water contents less than 100 parts per million |
| Lubricant: | any inert liquid, for example, anhydrous toluene |

During high energy ball milling, the temperature in the mill will rise due to the heat generated by the collision processes. In addition, the exothermic nature of the mechanical reduction reaction may cause an additional rise in temperature. In some cases, the reaction rate will be sufficiently high so that self-combustion of the constituents will result and melting of the powders may occur. This self-combustion process is known as "self-propagating high temperature synthesis". The products formed during the self-combustion may be further reduced by subsequent milling.

The milling time required for combustion may be substantially shortened by stopping the mill after an initial period of milling, keeping the powder stationary for a fixed period of time and then recommencing the milling process. This procedure may also be used to cause combustion to occur in those reactions where there is no combustion during continuous milling.

The process of the invention may also be used to produce ultra-fine grain size particles of metals, alloys or ceramic materials directly as a consequence of the mechanical activation. These ultra-fine particles may have a grain size of 1 micron or less.

The process is applicable to the reduction of a wide range of metal compounds including oxides, sulphides, halides, hydrides, nitrides, carbides and/or phosphates. The only limitations are that there must be a negative free energy change associated with the reduction process. It is necessary that the particles of solid reaction materials are fractured during the mechanical activation to expose fresh surfaces to the reducing agent. The fracturing may also occur as a result of the chemical reactions occurring in the system.

As described above, the reducing agent may be solid, liquid or gaseous. Candidate solid reducing agents include highly electronegative solids such as calcium, magnesium and sodium. Suitable liquid reducing agents include lithium alkyls dissolved in hydrocarbons, alkali metals dissolved in liquid ammonia and sodium-potassium alloys. Examples of gaseous reducing agents include hydrogen, chlorine and carbon monoxide.

On completion of the mechanical activation, the reducing agent may be removed from the reaction product by standard chemical means. For example, where calcium metal is used as the reducing agent, the resulting calcium oxide may be hydrated by reacting it with water. The resultant calcium hydroxide may then be dissolved in a suitable solvent and removed by filtration. In some instances, it may not be necessary to remove the reducing elements on completion of the process. For example, the oxide particles formed during the reaction may then form the basis of the hard phase in a dispersion hardened alloy.

It will be appreciated from the above description that the invention is not limited to the use of any particular metal compounds of reducing agents. Furthermore, the material being reduced or the reducing agent(s) may be either solid, liquid or gas with the proviso that at least one of the materials is solid.

The term "alloy" as used herein refers to a metallic solid formed from an intimate combination of two or more metals and/or metalloids. The alloys which may be produced by the invention include those where the major element is from the transition metal group or the lanthanide series (the rare earths) and further include all binary, tertiary and higher order alloys. Minor additions may include metalloids or non-metals such as boron or carbon, for example, in the production of rare earth permanent magnet materials, such as, $Nd_{16}Fe_{26}B_8$.

The alloys may be single phase solid solutions, stoichiometric compounds or consist of two or more phases where each phase may be a solid solution or stoichiometric compound. Examples of the metals and/or alloys which may be produced by the process include copper, zinc, iron, titanium, alpha or beta brass (CuZn), NiTi, SmCo$_5$ and Misch metal.

The term "ceramic material" as used herein refers to a material which contains one or more phases that are compounds of metals and non-metals. Ceramic materials comprise all engineering materials or products (or portions thereof) that are chemically inorganic, except metals and alloys. The types of ceramic materials that may be produced by the process of the invention include ceramic borides, carbides, nitrides and oxides. For example, titanium boride and zirconium carbide may be produced by the following reactions:

$$TiCl_4 + 2Mg + 2B \rightarrow TiB_2 + 2MgCl_2$$

$$ZrCl_4 + 3Mg + CO \rightarrow ZrC + MgO + 2MgCl_2.$$

The process of the invention may also be used to produce ceramic material superconductors, for example as shown in the following reactions:

$$\tfrac{1}{2}Y_2O_3 + 3CuO + 2Ba \longrightarrow YBa_2Cu_3O_{4.5}$$

$$\tfrac{1}{2}Y_2O_3 + 3CaO + Ba + BaO_2 \longrightarrow YBa_2Cu_3O_{6.5}$$

$$Y + 2BaO_2 + 3CuO \longrightarrow YBa_2Cu_3O_7.$$

One advantage of the above reactions is that the oxygen content of the superconductor is fixed by the stoichiometry rather than by thermal treatment.

The mechanically activated chemical reduction process described above additionally possess a number of advantages over conventional processing:

1. The process allows the direct formation of substantially pure metals from reducible metal compounds, without the use of high temperatures.

2. The process allows the direct formation of crystalline or amorphous alloys from reducible metal compounds without first having to process the compounds into pure metals and then combine the pure metals to form the alloys.

3. The process allows the direct formation of powder products, without having to first manufacture the bulk metal, alloy or ceramic material and then convert it to a powder form.

4. The process allows the direct formation of ultra-fine grain size particles of metals, alloys or ceramic material without having to first produce the metal, alloy or ceramic material and then generate ultra-fine grain size particles.

Advantages (1) to (4) are important in the case of reactive elements and alloys, such as the rare earthsm which are difficult to produce using conventional high temperature (melt/cast or powder metallurgy) technologies. The resulting product should be suitable for a wide range of powder metallurgical applications.

The invention is further described in and illustrated by the following examples. These examples are not to be construed as limiting the invention in any way.

EXAMPLE 1

Copper oxide and calcium were milled together using toluene as a lubricant in an inert atmosphere (N$_2$ gas) using a SPEX Model 8000 mixer/mill, hardened steel vial and 3 tungsten carbide balls. The total mass of the balls was approximately 24 grams and the ball to powder mass ratio was approximately 3:1. Equal atomic masses of copper (as copper oxide) and calcium, together with an additional 10% of calcium were milled for up to 24 hours. Approximately 6 ml of toluene was used as the lubricant. Following milling the products of the reaction were identified by X-ray diffraction. The milling was found to cause the reaction:

$$CuO + Ca \rightarrow Cu + CaO$$

to occur progressively as a function of time. After 24 hours milling the reaction was complete.

At the completion of milling, the calcium oxide and the unreacted calcium were removed using a standard technique which involved hydrating the CaO by reacting with water. The resulting Ca(OH)$_2$ was then dissolved in dilute mineral acid and removed by filtration.

EXAMPLE 2

Copper oxide and calcium were milled together as detailed in Example 1, with the exception that no lubricant was added to the powders prior to milling and the steel balls were substituted for tungsten carbide. The powders were "dry" milled for various times up to 24 hours. After approximately 10 minutes of milling sufficient heat was generated by the exothermic heat of reaction of the reduction process, to cause spontaneous combustion and melting of the powders. Examination of the resulting products of the combustion process showed the presence of Cu, CuO, Ca, CaO, CaCu$_5$, Cu$_2$O and Cu$_2$CaO$_3$. After milling for a further 24 hours, mechanical reduction and alloying occurred such that the final phases present were CaO and Cu.

EXAMPLE 3

Copper oxide and nickel were milled together as in Example 2. Milling caused the reduction reaction:

$$CuO + Ni \rightarrow Cu + NiO$$

to occur progressively such that after 24 hours milling the reaction was complete. No evidence of self-combustion as in Example 2 was observed.

EXAMPLE 4

Equal atomic masses of Zn (as ZnO) and Cu (as CuO) were dry milled with 10% excess calcium as per Examples 2 and 3. In this experiment the steel vial was cooled to 0° C. and argon gas was used as the inert atmosphere. The milling time was 24 hours. At the completion of milling, the products consisted of the $\beta'$ CuZn intermetallic phase and CaO. The relevant reaction is:

$$CuO + ZnO + 2Ca \rightarrow 2CaO + CuZn \, (\beta' \text{ brass})$$

EXAMPLE 5

Equal atomic masses of titanium (as liquid titanium tetrachloride) and magnesium, together with an additional 15% magnesium were milled as in Example 1 using eight stainless steel balls of total mass 86 grams. The milling caused the reaction:

$$TiCl_4 + 2Mg \rightarrow Ti + 2MgCl_2$$

to occur progressively as a function of time. After 16 25 hours milling, the reaction was complete. At the completion of milling one of the following procedures was used to remove the $MgCl_2$ and unreacted Mg from the Ti.

In procedure 1, the milled powder was washed in a solution of 10% HCl in water to dissolve the $MgCl_2$ and Mg, followed by washing in distilled water and filtration. With procedure 2, the $MgCl_2$ and Mg were removed by vacuum distillation for 24 hours at 900° C. under a vacuum of $10^{-5}$ torr. Procedures 1 and 2 resulted in average powder sizes of approximately 0.2 and 2 $\mu$m, respectively.

EXAMPLE 6

Titanium tetrachloride and magnesium were milled together as described in Example 5, except that the milling was carried out at a temperature of $-55°$ C. by cooling the vial. At $-55°$ C. titanium tetrachloride is a solid (m.p.$= -24°$ C.) and milling involved a solid state reaction. After 3 hours milling, the reaction was complete.

EXAMPLE 7

Appropriate amounts of $TiCl_4$, $VCl_3$ and $AlCl_3$ to form the alloy Ti-6%V-4%Al were milled with 15% excess magnesium. The milling was carried out as described in Example 5 with the alloy powder being formed after 18 hours.

EXAMPLE 8

Equal atomic masses of zinc (as ZnO) and titanium, together with an excess 10% titanium were dry milled as described in Example 1. X-ray diffraction analysis showed that the reaction:

$$2ZnO + Ti \rightarrow 2Zn + TiO_2$$

had initiated after approximately 5 hours and was essentially complete after 49 hours. A combustion reaction did not occur.

In a separate series of tests the samples were milled for 5.5 hours. The mill was turned off for periods of time between 2 and 13 hours. In the sample held for 13 hours, combustion occurred 2 seconds after milling was restarted. The time required for combustion increased with decreasing holding time, such that for a sample held for 6 hours, combustion occurred 73 seconds after the mill was restarted. Combustion was not observed in a sample held stationary for 2 hours. The time required for combustion after holding for 13 hours was found to decrease with an increase in the initial milling time; such that in a sample milled for 6 hours, combustion occurred after 1 second; after 5 hours, combustion occurred after 3 seconds while no combustion occurred in the sample milled for 4.5 hours.

EXAMPLE 9

The following reactions were carried out by milling the indicated reactants together as in Example 1. Approximately 8 grams of powders were used in all tests, including a 10% stoichiometric excess of the reducing agent. Milling times ranged from a few seconds to 48 hours.

$$3CuO + 2Al \rightarrow 3Cu + Al_2O_3$$

$$CuO + Mg \rightarrow Cu + MgO$$

$$2CuO + Ti \rightarrow 2Cu + TiO_2$$

$$CdO + Ca \rightarrow Cd + CaO$$

$$Fe_2O_3 + 3Ca \rightarrow 2Fe + 3CaO$$

$$5Ti + 2V_2O_5 \rightarrow 4V + 5TiO_2$$

$$ZnO + Ca \rightarrow Zn + CaO$$

$$4CuO + 3Fe \rightarrow 4Cu + Fe_3O_4$$

EXAMPLE 10

Appropriate masses of $Y_2O_3$, Ba and CuO to give the overall composition $YBa_2Cu_3O_{4.5}$ were milled together as described in Example 2. After approximately 15 minutes of milling the reaction:

$$\tfrac{1}{2}Y_2O_3 + 2Ba + 3CuO \rightarrow YBa_2Cu_3O_{4.5}$$

occurred by a combustion reaction.

EXAMPLE 11

Appropriate masses of Y, $BaO_2$ and CuO to give the overall composition $YBa_2Cu_3O_7$ were milled together as described in Example 2. After approximately 14 minutes of milling the reaction:

$$Y + 2BaO_2 + 3CuO \rightarrow YBa_2Cu_3O_7$$

occurred by a combustion reaction.

We claim:

1. A process for the production of a metal product comprising subjecting a mixture of at least one reducible metal compound and at least one solid or liquid reducing agent to mechanical activation, said reducing agent being capable of reducing said reducible metal compound whereby the reducible metal compound is reduced by the reducing agent to provide the metal product.

2. A process as claimed in claim 1, wherein the metal product is a metal alloy produced by subjecting a mixture of two or more reducible metal compounds and at least one reducing agent to mechanical activation, whereby the reducible metal compounds are reduced by the reducing agent to produce the metal alloy.

3. A process as claimed in claim 2, wherein at least one metal is further included in the mixture and incorporated into the metal product.

4. A process as claimed in claim 2, wherein at least one metalloid is further included in the mixture and incorporated into the metal product.

5. A process as claimed in claim 2, wherein mechanical activation is achieved by high energy ball milling.

6. A process as claimed in claim 2, wherein the mechanical activation is conducted in an inert or reducing atmosphere.

7. A process as claimed in claim 2, wherein a lubricant is added to the mixture.

8. A process as claimed in claim 2, wherein the reducible metal compound is selected from the group consisting of metal oxides, sulphides, halides, hydrides, nitrides, carbides and phosphates.

9. A process as claimed in claim 2, wherein the reducing agent is a solid selected from the group consisting of calcium, magnesium and sodium.

10. A process as claimed in claim 2, wherein the reducing agent is a liquid selected from the group consisting of lithium alkyls dissolved in hydrocarbons, alkali metals dissolved in liquid ammonia and a sodium-potassium alloy.

11. A process as claimed in claim 1, wherein the metal product is a composition of matter comprised of two or more metals produced by subjecting a mixture of two or more reducible metal compounds and at least one reducing agent to mechanical activation, whereby the reducible metal compounds are reduced by the reducing agent to produce the metal product.

12. A process as claimed in claim 11, wherein at least one metal is further included in the mixture and incorporated into the metal product.

13. A process as claimed in claim 11, wherein at least one metalloid is further included in the mixture and incorporated into the metal product.

14. A process as claimed in claim 11, wherein mechanical activation is achieved by high energy ball milling.

15. A process as claimed in claim 11, wherein the mechanical activation is conducted in an inert or reducing atmosphere.

16. A process as claimed in claim 11, wherein a lubricant is added to the mixture.

17. A process as claimed in claim 11, wherein the reducible metal compound is selected from the group consisting of metal oxides, sulphides, halides, hydrides, nitrides, carbides and phosphates.

18. A process as claimed in claim 11, wherein the reducing agent is a solid selected from the group consisting of calcium, magnesium and sodium.

19. A process as claimed in claim 11, wherein the reducing agent is a liquid selected from the group consisting of lithium alkyls dissolved in hydrocarbons, alkali metals dissolved in liquid ammonia and a sodium-potassium alloy.

20. A process as claimed in claim 1, wherein at least one metal is further included in the mixture and incorporated into the metal product.

21. A process as claimed in claim 1, wherein at least one metalloid is further included in the mixture and incorporated into the metal product.

22. A process as claimed in claim 1, wherein mechanical activation is achieved by high energy ball milling.

23. A process as claimed in claim 1, wherein the mechanical activation is conducted in an inert or reducing atmosphere.

24. A process as claimed in claim 1, wherein a lubricant is added to the mixture.

25. A process as claimed in claim 1, wherein the reducible metal compound is selected from the group consisting of metal oxides, sulphides, halides, hydrides, nitrides, carbides and phosphates.

26. A process as claimed in claim 1, wherein the reducing agent is a solid selected from the group consisting of calcium, magnesium and sodium.

27. A process as claimed in claim 1, wherein the reducing agent is a liquid selected from the group consisting of lithium alkyls dissolved in hydrocarbons, alkali metals dissolved in liquid ammonia and a sodium-potassium alloy.

28. A process for the production of a metal product which comprises subjecting at least one reducible metal compound to mechanical activation in an inert or reducing atmosphere for preventing the oxidation of said metal product; said mechanical activation of said metal compound being conducted in the presence of an additional gaseous reducing agent capable of reducing said metal compound.

29. The method of claim 28 wherein two or more reducible metal compounds are reduced to form a metal alloy product.

30. The method of claim 29 wherein at least one metal is further incorporated into the metal product by subjecting said further incorporated metal to mechanical activation along with said metal compound.

31. The method of claim 29 wherein at least one metalloid is incorporated into the metal product by subjecting said metalloid to mechanical activation along with said metal compound.

32. The method of claim 29 wherein said mechanical activation is achieved by high energy ball milling.

33. The method of claim 29 wherein said mechanical activation is conducted in the presence of a lubricant.

34. The method of claim 29 wherein the reducible metal compound is selected from the group consisting of metal oxides, sulfides, halides, hydrides, nitrides, carbides and phosphates.

35. The method of claim 28 wherein two or more reducible metal compounds are reduced to form a composition of matter comprised of two or more metals.

36. The method of claim 35 wherein at least one metal is further incorporated into the metal product by subjecting said further incorporated metal to mechanical activation along with said metal compound.

37. The method of claim 35 wherein at least one metalloid is incorporated into the metal product by subjecting said metalloid to mechanical activation along with said metal compound.

38. The method of claim 35 wherein said mechanical activation is achieved by high energy ball milling.

39. The method of claim 35 wherein said mechanical activation is conducted in the presence of a lubricant.

40. The method of claim 30 wherein the reducible metal compound is selected from the group consisting of metal oxides, sulfides, halides, hydrides, nitrides, carbides and phosphates.

41. The method of claim 28 wherein at least one metal is further incorporated into the metal product by subjecting said further incorporated metal to mechanical activation along with said metal compounds.

42. The method of claim 28 wherein at least one metalloid is incorporated into the metal product by subjecting said metalloid to mechanical activation along with said metal compound.

43. The method of claim 28 wherein said mechanical activation is achieved by high energy ball milling.

44. The method of claim 28 wherein said mechanical activation is conducted in the presence of a lubricant.

45. The method of claim 28 wherein the reducible metal compound is selected from the group consisting of metal oxides, sulfides, halides, hydrides, nitrides, carbides and phosphates.

* * * * *